United States Patent [19]

Ozaki et al.

[11] Patent Number: 4,994,893

[45] Date of Patent: Feb. 19, 1991

[54] FIELD EFFECT TRANSISTOR SUBSTANTIALLY COPLANAR SURFACE STRUCTURE

[75] Inventors: Hiroji Ozaki; Takahisa Eimori; Yoshinori Tanaka; Wataru Wakamiya; Shinichi Satoh, all of Hyogo, Japan

[73] Assignee: Mitsubishi Denki Kabushiki Kaisha, Tokyo, Japan

[21] Appl. No.: 405,284

[22] Filed: Sep. 11, 1989

[30] Foreign Application Priority Data

Sep. 29, 1988 [JP] Japan ................... 63-247670

[51] Int. Cl.$^5$ ................ H01L 23/48; H01L 29/40; H01L 29/68
[52] U.S. Cl. .......................... 357/68; 357/53; 357/23.6
[58] Field of Search ................ 357/68, 53, 23.6

[56] References Cited

U.S. PATENT DOCUMENTS 4,843,453  6/1989  Hooper et al. ................ 357/68

FOREIGN PATENT DOCUMENTS 60-10662  3/1985  Japan.
62-188268  1/1987  Japan.
62-154784  8/1987  Japan.

OTHER PUBLICATIONS

Nishiyama et al., "Two Step Tungsten Selective CVD for High Speed CMOS Device Applications", IEEE V LSI Symposium, pp. 97-98, 1988.

Primary Examiner—Rolf Hille
Assistant Examiner—Robert P. Limanek
Attorney, Agent, or Firm—Lowe, Price, LeBlanc, Becker & Shur

[57] ABSTRACT

A semiconductor device has MOS field effect transistors isolated by a field shield. The field shield has a gate of conductor layers formed spaced apart from each other on a silicon substrate through an insulating film and with the surface thereof being covered with an insulating film. In regions isolated by the field shield, MOS field effect transistors are formed. Each of the MOS field effect transistors has a gate electrode of a conductor layer formed on the silicon substrate through an insulating film and with the surface thereof being covered with an insulating film. An impurity diffused region is formed in a region on the silicon substrate between the gate electrode and the field shield. A portion on an exposed surface of the impurity diffused region between the field shield and the gate electrode is selectively filled with a tungsten buried layer. The tungsten buried layer is formed, flattened relative to the gate electrode and the gate constituting the field shield.

12 Claims, 8 Drawing Sheets $t_1 > t_2$

FIELD EFFECT TRANSISTOR SUBSTANTIALLY COPLANAR SURFACE STRUCTURE

BACKGROUND OF THE INVENTION

1. Field of the Invention

The present invention relates generally to semiconductor devices, and more particularly, to field effect transistors (FETs) having structures in which the resistance of interconnections to FETs is decreased and substantially coplanar surface structures. The present invention further relates to a method of manufacturing such devices.

2. Description of the Background Art

When the present invention is applied to a dynamic random access memory (referred to as DRAM hereinafter) having memory cells each having a stacked capacitor structure, the most preferable effect is obtained. Therefore, description is made on a DRAM having memory cells of a stacked capacitor structure. The DRAM has been already well known. FIG. 3 is a block diagram showing one example of an entire structure of such a conventional DRAM.

Referring to FIG. 3, the DRAM comprises a memory cell array 100 including a plurality of memory cells each serving as a storing portion, a row decoder 200 and a column decoder 300 each connected to an address buffer for selecting addresses, and an input/output interface portion comprising sense amplifiers connected to an input/output circuit. The plurality of memory cells each serving as a storing portion are provided in a matrix of a plurality of rows and columns. Each of the memory cells is connected to a corresponding word line connected to the row decoder 200 and a corresponding bit line connected to the column decoder 300. The memory cells constitute the memory cell array 100. A memory cell is selected by a single word line and a single bit line selected by the row decoder 200 and the column decoder 300 upon receipt of externally applied row and column address signals. Data is written to the selected memory cell or the data stored in the memory cell is read out. Reading/writing of this data is commanded by a read/write control signal applied to a control circuit.

Data is stored in the N ( = n ×m)-bit memory cell array 100. Address information concerning a memory cell from/to which reading/writing is performed are stored in the row and column address buffers, so that an m-bit memory cell is coupled to the sense amplifiers through bit lines by selecting a particular word line (one word line out of n word lines) by the row decoder 200. Then, one sense amplifier out of the sense amplifiers is coupled to the input/output circuit by selecting a particular bit line (one bit line out of m bit lines) by the column decoder 300, so that reading or writing is performed according to the command of the control circuit.

FIG. 4 is a diagram showing an equivalent circuit of one memory cell 30 in the DRAM shown for explaining an operation for reading/writing data to/from memory cells. In FIG. 4, the memory cell 30 comprises a set of a field effect transistor Q and a capacitor Cs. The field effect transistor Q has its gate electrode connected to a word line 40, one source-drain electrode connected to one electrode of the capacitor Cs, and another source-drain electrode connected to a bit line 50. At the time of writing data, a predetermined voltage is applied to the word line 40 so that the field effect transistor Q is rendered conductive, whereby charges applied to the bit line 50 are stored in the capacitor Cs. On the other hand, at the time of reading out data, a predetermined voltage is applied to the word line 40 so that the field effect transistor Q is rendered conductive, whereby the charges stored in the capacitor Cs are extracted through the bit line 50.

FIG. 5 is a partial plan view showing planar arrangement of a peripheral circuit including a decoder portion or the like other than a memory cell array region in the conventional DRAM. FIG. 5 shows three field effect transistors T1, T2 and T3. Each of the transistors comprises a transfer gate 4 and N-type impurity diffused regions 60a and 60b to be a source/drain region arranged on both sides of the transfer gate 4. The transfer gate 4 to be a gate electrode constituting each of the field effect transistors is formed in accordance with a predetermined interconnection pattern. In addition, contact holes 14a and 14b are respectively formed in the N-type impurity diffused regions 60a and 60b to be a source/drain region constituting each of the transistors so as to electrically contact with the regions. In FIG. 5, the contact hole 14b formed in the transistor T1, the contact hole 14b formed in the transistor T2 and the contact hole 14a formed in the transistor T3 are provided to be aligned in a lateral direction. The reason is that the contact holes are aligned in a constant direction irrespective of different sizes of impurity diffused regions respectively constituting the transistors T1, T2 and T3 in order to efficiently form an interconnection pattern or the like in the design of a semiconductor device. Therefore, margins differ in the impurity diffused regions respectively constituting the transistors T1, T2 and T3, so that respective distances between the contact holes and the transfer gate, i.e., contact-gate spacing D1, D2 and D3 differ from each other.

FIG. 6A is a partially sectional view showing a cross section taken along a line VI—VI shown in FIG. 5. FIG. 7A is a partially sectional view showing a cross section taken along a line VII—VII shown in FIG. 5. Referring to FIGS. 6A and 7A, description is made on a structure of a field effect transistor having different contact-gate spacing (D1, D2).

Thick isolation oxide films 2 are formed spaced apart from each other on a P-type silicon substrate 1 to isolate field effect transistors. An N channel MOS transistor is formed in a region surrounded by the isolation oxide films 2. The N channel MOS transistor comprises a transfer gate 4 and N-type impurity diffused regions 60a and 60b to be a source/drain region. The transfer gate 4 is formed over the silicon substrate 1 through a transfer gate oxide film 3, and a sidewall insulating film 7 is formed on both sidewalls thereof. An interlayer insulating film 12 is formed so as to cover this N channel MOS transistor. Contact holes 14a and 14b are respectively formed on the interlayer insulating film 12 so as to reach the surfaces of N-type impurity diffused regions 60a and 60b to be a source/drain region. Interconnection layers 20a and 20b are respectively provided so as to electrically contact with the N-type impurity diffused regions 60a and 60b through the contact holes 14a and 14b.

It is assumed that in each of the N channel MOS transistors T1 and T2 shown in FIGS. 5, 6A and 7A, gate lengths L1 and L2 and gate widths W1 and W2 respectively take the same value. In addition, it is assumed that junction depths $x_j$ of the N-type impurity diffused regions take the same value. Under such conditions, respective drain current-drain voltage characteristics, as characteristics of the field effect transistor, in the transistors T1 and T2 are compared with each other.

FIG. 6B is a graph showing drain current (Id)-drain voltage (Vd) characteristics of the N channel MOS transistor T1 shown in FIG. 6A, and FIG. 7B is a graph showing drain current-drain voltage characteristics of the N channel MOS transistor T2 shown in FIG. 7A. According to the graphs, in the transistor T1 having small contact-gate spacing (D1), the slope of the rise of the drain current is steep and an angle $\alpha 1$ is small. On the other hand, in the transistor T2 having large contact-gate spacing (D2), the slope of the rise of the drain current is gentle and an angle $\alpha 2$ is large. In addition, the transistor T2 having large contact-gate spacing, the value of the drain current at the same gate voltage (VG) is smaller. From the foregoing, it can be understood that a transistor having a large interconnection resistance to the drain/source region and a transistor having a small interconnection resistance thereto are formed depending on contact-gate spacing. Thus, characteristics of a transistor such as the operation speed varies between the transistors having the same gate length and gate width.

Furthermore, as the semiconductor device is miniaturized, N-type impurity diffused regions serving as a source/drain region are formed such that the junction depths $x_j$ thereof are small. This means that a source-drain resistance (resistance of an impurity diffused region) becomes large. Thus, if and when the source-drain resistance becomes large, the variation in the above described contact-gate spacing greatly affects characteristics of a transistor.

In order to solve the above described problem, a field effect transistor having a structure in which a polysilicon (polycrystalline silicon) layer is stacked on the surfaces of impurity diffused regions to be a source/drain region is disclosed in Japanese Pat. Laying-Open No. 62-154784/(1987). FIG. 10 shows a cross-sectional structure of this field effect transistor.

Referring to FIG. 10, thick isolation oxide films 2 are formed spaced apart from each other on a P-type silicon substrate 1 to achieve isolation. An N channel MOS transistor is formed in a region surrounded by the isolation oxide films 2. This N channel MOS transistor comprises a transfer gate 4 formed over the silicon substrate 1 through a transfer gate oxide film 3 and N-type impurity diffused regions 60a and 60b to be a source/drain region. An insulating oxide film 5 is formed on the transfer gate 4, and a sidewall insulating film 7 is formed on sidewalls thereof. A polysilicon layer 22 is formed on the surfaces of the N-type impurity diffused regions 60a and 60b.

In the N channel MOS transistor having such a structure, the polysilicon layer 22 electrically contacts with the N-type impurity diffused regions 60a and 60b. Therefore, contact-gate spacing D3 becomes short. In addition, interconnection layers 20a and 20b can be provided in a desired position on the polysilicon layer 22. More specifically, the contact-gate spacing D3 is uniformly decreased in each of transistors, so that a source-drain interconnection having decreased resistance is provided. However, the polysilicon layer 22 in this structure is formed using etchback techniques, so that it is difficult to make the thickness thereof uniform between the transistors. Therefore, it is difficult to uniformly decrease the resistance of the source-drain interconnection between the transistors.

FIGS. 9A to 9C are partial sectional views showing, in this order, the method for forming the polysilicon layer 22 by using etch back technique in the structure shown in FIG. 8. The etch back technique is one of the methods for making the layer coplanar. Referring to FIG. 9A, the polysilicon layer 22 is formed on the entire surface, and a photoresist film 23 is applied thick on the polysilicon layer 22. Thereafter, as shown in FIG. 9B, the photoresist film 23 and the polysilicon layer 22 are removed so as to expose the surface of the insulating oxide film 5 with the speed of etching the photoresist film 23 and the polysilicon layer 22 made equal to each other, by using, for example, RIE (reactive ion etching) technique. Thereafter, as shown in FIG. 9C, the photoresist film 23 is removed by turning the same to ash in oxide plasma. When the polysilicon layer 22 is made coplanar in this manner, the thickness $t_2$ of the polysilicon layer 22 on the isolating oxide film 2 is made smaller than the thickness $t_1$ of the polysilicon layer 22 on the N type impurity diffused regions 60a and 60b. Therefore, it is difficult to make uniform the thickness of the polysilicon layer 22. Accordingly, the resistance between the polysilicon layer 22 and the interconnection layers formed thereon is not uniform.

On the other hand, in a memory cell array region in the DRAM shown in FIG. 3, a more highly integrated field effect transistor is formed, as compared with that in a region where a peripheral circuit is formed shown in FIG. 5. FIG. 11 is a partially sectional view showing a structure of a memory cell having such a highly integrated field effect transistor and having a stacked capacitor structure. Referring to FIG. 11, description is made on the structure of the memory cell.

Thick isolation oxide films 2 are formed spaced apart from each other on a major surface of a P type silicon substrate 1 to isolate memory cells. Memory cells are formed in a region surrounded by the isolation oxide films 2. Each of the memory cells comprises an N channel MOS transistor and a capacitor. The N channel MOS transistor comprises a transfer gate 40 shared with a word line and an N-type impurity diffused region. The transfer gate 40 is formed over the silicon substrate 1 through a transfer gate oxide film 3. The N-type impurity diffused region to be a source/drain region has an LDD (lightly doped drain) structure comprising N-type impurity diffused regions 6a and 6b of low concentration and N-type impurity diffused regions 8a and 8b of high concentration. A sidewall insulating film 7 is formed on both sidewalls of the transfer gate 40.

On the other hand, a capacitor is formed so as to be connected to the N channel MOS transistor. The capacitor comprises a storage node 9, a capacitor gate oxide film 10 formed to cover the storage node 9, and a cell plate 11 formed to cover the capacitor gate oxide film 10. The storage node 9 is formed so as to electrically contact with one set of the N-type impurity diffused regions 6a and 8a constituting the N channel MOS transistor. In the above described manner, each of the memory cells comprises an N channel MOS transistor and a capacitor.

In order to send information charges to each of the memory cells, a bit line 50 is formed so as to electrically contact with the other set of the N-type impurity diffused regions 6b and 8b constituting the N channel MOS transistor. This bit line 50 is formed through a contact hole 13 formed on an interlayer insulating film 12 formed above each of the memory cells.

In the memory cell having the above described stacked capacitor structure, a distance a between sidewalls of the contact hole 13 becomes smaller and smaller as the memory cell is miniaturized. Therefore, the ratio of a distance b between the upper surface of the interlayer insulating film 12 covering each of the memory cells and the surface of the silicon substrate 1 to the distance a between the sidewalls of the contact hole 13 becomes larger and larger as the memory cell is miniaturized. More specifically, as a memory cell region is miniaturized, a stepped structure has a larger aspect ratio. This makes it difficult to uniformly pattern the bit line 50 formed so as to cover the interlayer insulating film 12. More specifically, it becomes difficult to make the stepped structure coplanar. For example, as shown in FIG. 10, an interconnection layer such as the bit line formed to electrically contact with the impurity diffused region is formed such that the thickness thereof becomes small on the sidewalls of the contact hole. Therefore, electrical disconnection may occur. In addition, the junction depth $x_j$ of the impurity diffused region becomes small as the memory cell is miniaturized, and the thickness of the interconnection layer formed so as to electrically contact with the impurity diffused region becomes small so that the resistance thereof is increased.

As described above, in the peripheral circuit portions of a DRAM, respective transistors are arranged with the efficiency in design given priority. Meanwhile, in the memory cell area of the DRAM, the transistors are arranged with the degree of integration given priority. Consequently, there have been the following drawbacks.

For example, in the conventional DRAM, characteristics of a field effect transistor constituting a peripheral circuit or the like varies even if it has the same gate length and gate width according to the relative relation between the source-drain resistance (resistance of an impurity diffused region) and the contact-gate spacing.

On the other hand, in a semiconductor device including a highly integrated field effect transistor, the cross-sectional structure thereof has a large aspect ratio due to high integration density of a memory cell in, for example, a region where a memory cell is formed (referred to as memory cell forming region hereinafter) in the DRAM, so that it becomes difficult to make the semiconductor device coplanar.

Meanwhile, a structure in which a tungsten layer is selectively formed in a source/drain region to reduce the resistance of a source-drain interconnection is disclosed in an article by A. Nishiyama, entitled "Two Step Tungsten Selective CVD for High Speed CMOS Device Applications", Toshiba VLSIR. Center 1988 IE$^3$ [VLSI SYMPOSIUM], pp. 97-98. In this article, an interconnection structure, whose resistance is decreased, to a source/drain region is disclosed. However, this structure can not solve a problem of making coplanar in a miniaturized field effect transistor.

SUMMARY OF THE INVENTION

The present invention is to solve the above described problems and to provide a semiconductor device by which the resistance of an interconnection to an impurity diffused region can be decreased and which can be made coplanar.

Another object of the present invention is to provide a semiconductor device having an interconnection structure whose resistance is decreased and having a coplanar field effect transistor whose integration density is high.

Still another object of the present invention is to provide a DRAM having an interconnection structure the whose resistance is decreased and having coplanar memory cells of a stacked capacitor structure.

Further object of the present invention is to provide a method of manufacturing a semiconductor device by which the resistance of an interconnection to an impurity diffused region can be decreased and which can be made coplanar.

Another object of the present invention is to provide a method of manufacturing a semiconductor device having an interconnection structure whose resistance is decreased and having a flattened field effect transistor whose integration density is high and a manufacturing method therefor.

Yet another object of the present invention is to provide a method of manufacturing a DRAM having an interconnection structure in which resistance is decreased and having coplanar memory cells of a stacked capacitor structure.

The semiconductor device according to the present invention comprises a semiconductor substrate, field shield conductor layers, a control gate conductor layer, an impurity region of a second conductivity type, and an interconnection layer. The semiconductor substrate has a major surface and is of a first conductivity type. The field shield conductor layers are formed spaced apart from each other on the major surface of the semiconductor substrate through an insulating film, and the surface thereof is covered with an insulating film. The control gate conductor layer is formed on the major surface of the semiconductor substrate between the field shield conductor layers through an insulating film, and the surface thereof is covered with an insulating film. The impurity region of the second conductivity type is formed between each of the field shield conductor layers and the control gate conductor layer and on the major surface of the semiconductor substrate. The interconnection layer is formed to selectively fill a portion on an exposed major surface of the impurity region between each of the field shield conductor layers and the control gate conductor layer. The interconnection layer is formed, substantially coplanar with the field shield conductor layers and the control gate conductor layer.

Preferably, in the semiconductor device according to the present invention, the interconnection layer may comprise a film selectively formed by chemical vapor deposition on the major surface of the impurity region. The film may comprise a metal film or a metal silicide film. In addition, the field shield conductor layer has a surface exposed, and the interconnection layer may be selectively formed on the surface thereof. An interconnection layer may be further formed on the surface of the interconnection layer.

Preferably, in the major surface of the semiconductor substrate, a plurality of field effect transistors may be formed, isolated by the field shield conductor layers covered with the insulating film. In addition, a capacitor having a stacked structure for storing charges may be connected to each of the field effect transistors.

In a method for manufacturing a semiconductor device according to the present invention, field shield conductor layers each having a surface covered with an insulating film are formed spaced apart from each other on a major surface of a semiconductor substrate through an insulating film. A control gate conductor layer having a surface covered with the insulating film is formed on the major surface of the semiconductor substrate between the field shield conductor layers through the insulating film. An impurity region of a second conductivity type is formed between each of the field shield conductor layers and the control gate conductor layer and on the major surface of the semiconductor substrate. An interconnection layer is formed between each of the field shield conductor layers and the control gate conductor layer so as to selectively fill a portion on an exposed major surface of the impurity region. Thus, the interconnection layer is formed, substantially coplanar with the field shield conductor layers and the control gate conductor layer.

In a preferred embodiment, the interconnection layer may be formed by selectively forming a film by chemical vapor deposition on the major surface of the impurity region.

In the present invention, the interconnection layer formed on the impurity region is formed so as to selectively fill a portion between each of the field shield conductor layers and the control gate conductor layer. Thus, the interconnection layer can be coplanar with the field shield conductor layer and the control gate conductor layer and the resistance of an interconnection to the impurity region is decreased.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
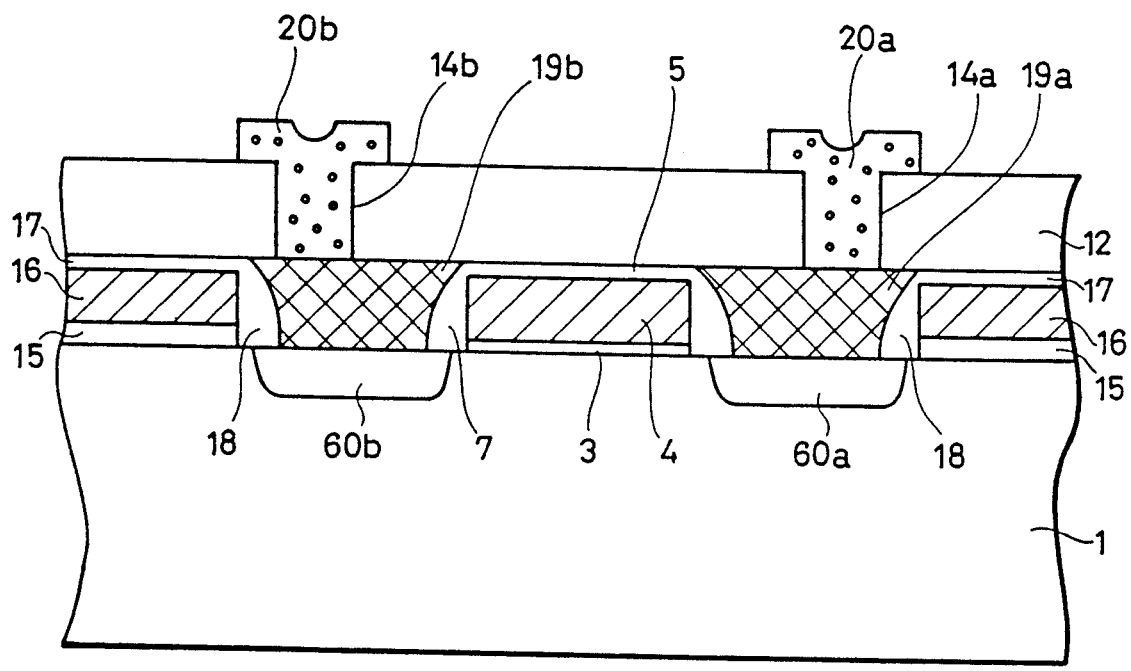
FIG. 1 is a partially sectional view showing a semiconductor device according to one embodiment of the present invention.

Referring now to the figures, one embodiment of the present invention will be described. FIG. 1 is a partially sectional view showing a structure of a semiconductor device according to one embodiment of the present invention. Referring to FIG. 1, description is made on a semiconductor device including a single field effect transistor.

Isolation layers, each having a gate, referred to as field shields, are formed spaced apart from each other on a P-type silicon substrate 1 to isolate field effect transistors. The field shields respectively comprise gate oxide films 15 for isolation formed spaced apart from each other on the silicon substrate 1, gates 16 for isolation formed on the isolation gate oxide films 15, and insulating oxide films 17 and sidewall insulating films 18 formed on upper surfaces and sidewalls of the isolation gates 16. A structure to which the field shield structured as described above is applied so as to miniaturize a memory cell is disclosed in Japanese Pat. Laying-Open No. 60-10662/(1985).

An N channel MOS transistor is formed in a region surrounded by the field shields. The N channel MOS transistor comprises a transfer gate 4 and N-type impurity diffused regions 60a and 60b to be a source/drain region. The transfer gate 4 is formed over the silicon substrate 1 through a transfer gate oxide film 3, and a sidewall insulating film 7 is formed on both sidewalls thereof. Tungsten buried layers 19a and 19b are buried to fill exposed portions on the silicon substrate 1 between the transfer gate 4 and the isolation gates 16. In the above described manner, making a interconnection layer coplanar is achieved. In addition, since the tungsten buried layers 19a and 19b are formed to electrically contact with the surfaces of the N-type impurity diffused regions 60a and 60b with contact-gate spacing being small, the resistance of an interconnection to the source/drain region is reduced. An interlayer insulating film 12 is stacked above them. Contact holes 14a and 14b are formed on the interlayer insulating film 12 so as to reach a part of each of the surfaces of the tungsten buried layers 19a and 19b. Interconnection layers 20a and 20b are respectively formed through the contact holes 14a and 14b so as to electrically contact with the tungsten buried layers 19a and 19b.

Description is now made on a manufacturing method taken when the structure according to the present invention is applied to a DRAM having memory cells of a stacked capacitor structure. FIGS. 2A to 2L are partially sectional views showing the steps of the manufacturing method. In each of the figures, the cross-sectional view in the left half thereof shows a cross section in a memory cell forming region, and the cross-sectional view in the right half thereof shows a cross section of a region where a peripheral circuit, an interconnection and the like are formed, other than the memory cell forming region.

Figure 2A:
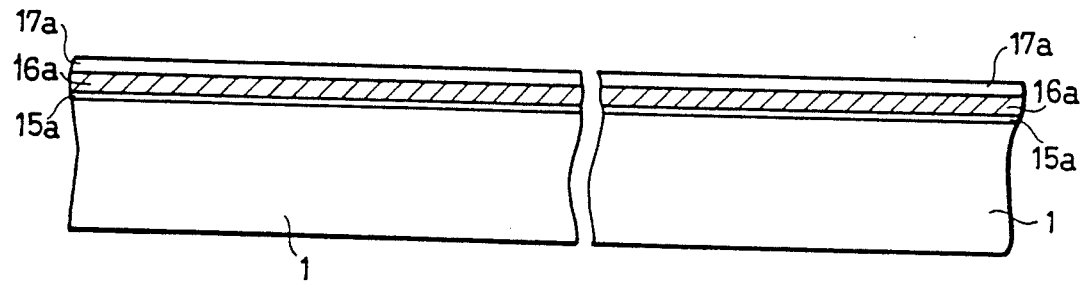
FIGS. 2A, 2B, 2C, 2D, 2E, 2F, 2G, 2H, 2I, 2J, 2K and 2L are partially sectional views showing the steps of a method for manufacturing the semiconductor device according to the present invention.

Referring now to FIG. 2A, a silicon oxide film 15a is deposited on a major surface of a P-type silicon substrate 1 to a thickness of 200 to 1000Å by a thermal oxidation process, a chemical vapor deposition process or the like. A polysilicon film 16a is formed on the silicon oxide film 15a by the chemical vapor deposition process or the like. N-type impurities having high concentration are doped to the polysilicon film 16a. The N+ doped polysilicon film having N-type impurities of high concentration doped thereto in advance may be deposited. Thereafter, a silicon oxide film 17a is deposited on the polysilicon film 16a to a thickness of about 2000Å on the polysilicon film 16a by the chemical vapor deposition process.

Figure 2B:
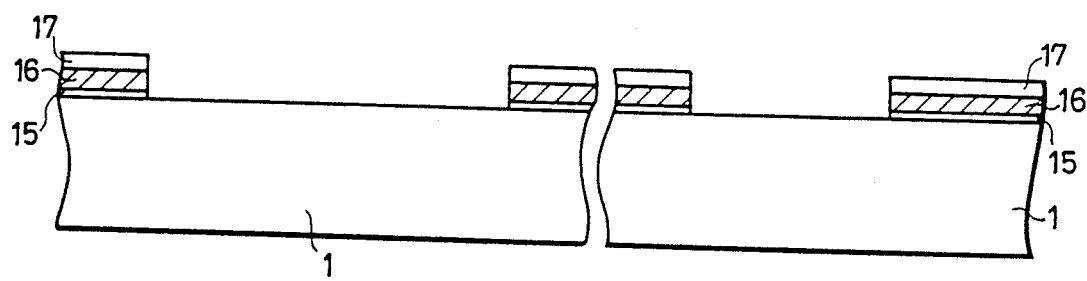

Referring next to FIG. 2B, the films are selectively removed by photolithographic techniques and etching techniques. As a result, isolation gate oxide films 15, isolation gates 16 and insulating oxide films 17 are formed.

Figure 2C:
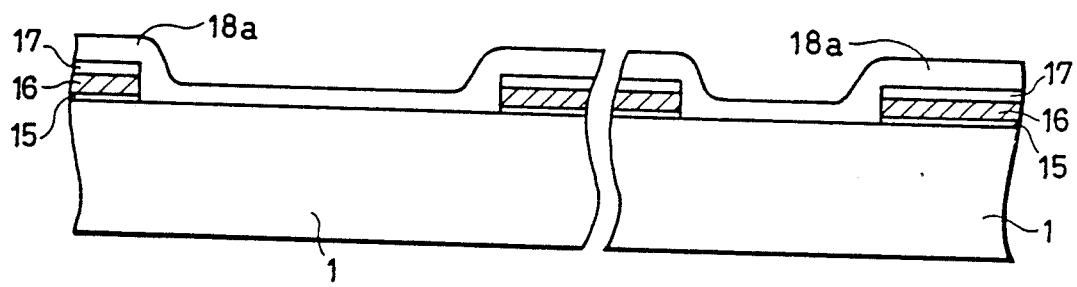

In FIG. 2C, a silicon oxide film 18a is deposed again on the entire surface by the chemical vapor deposition process.

Figure 2D:
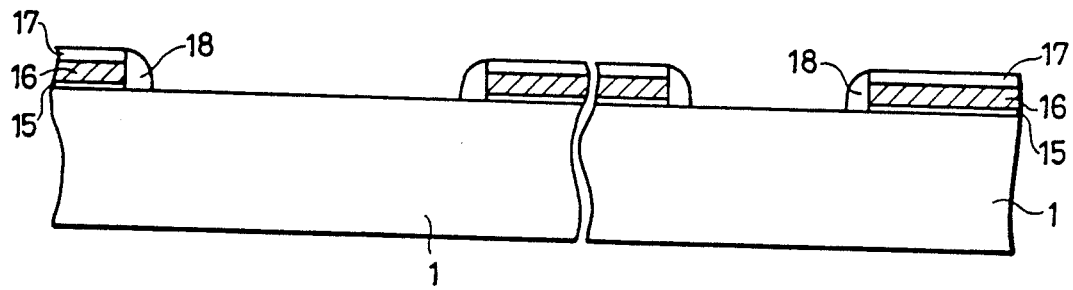

In FIG. 2D, this silicon oxide film 18a is etched by anisotropic etching such as reactive ion etching (RIE), so that sidewall insulating films 18 are formed on the sidewalls of the isolation gates 16. In the above described manner, field shields respectively having isolation gates for isolation are formed.

Figure 2E:
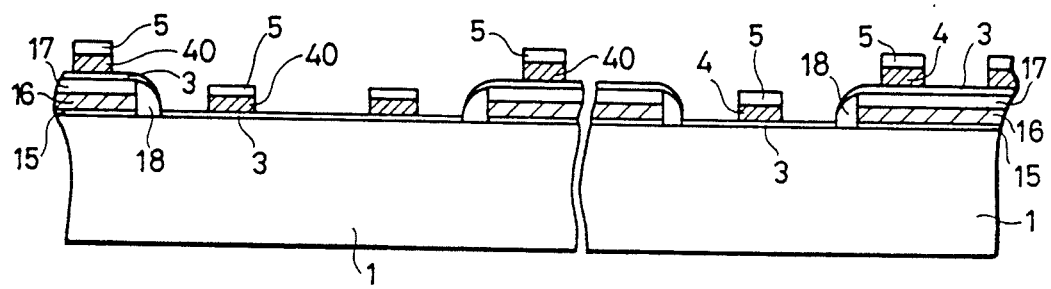

In FIG. 2E, a transfer gate oxide film 3 is formed to a thickness smaller than that of the silicon oxide film 15a by the thermal oxidation process or the like. A polysilicon film having N-type impurities of high concentration doped thereto, similarly to the polysilicon film 16a) serving as a transfer gate and a silicon oxide film are deposited on this transfer gate oxide film 3 by the chemical vapor deposition process or the like. The films are selectively removed by the photolithographic techniques and the etching techniques, so that transfer gates 40 and 4 and insulating oxide films 5 are formed.

Figure 2F:
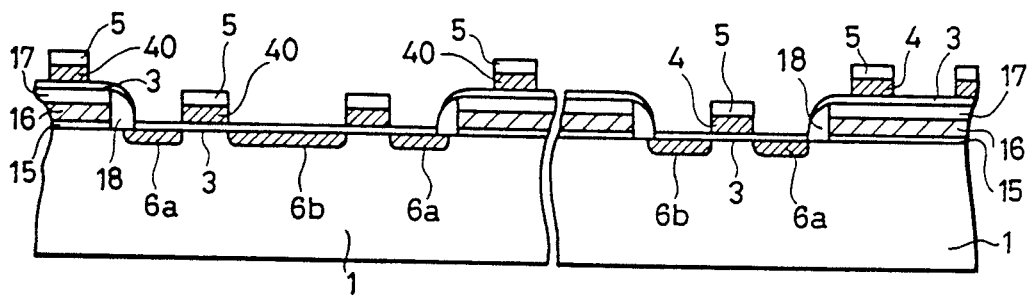

In FIG. 2F, N-type impurity ions of low concentration are implanted utilizing as masks the field shields and the transfer gates 40 and 4, so that N-type impurity diffused regions 6a and 6b of low concentration to be a source/drain region are formed.

Figure 2G:
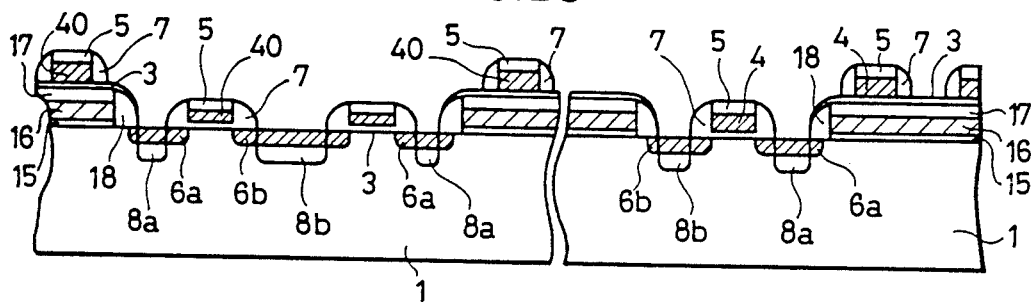

Thereafter, in FIG. 2G, a silicon oxide film is deposited on the entire surface to a thickness of about 2000Å by the chemical vapor deposition process or the like and then, the silicon oxide film is etched by the anisotropic etching such as reactive ion etching (RIE), so that sidewall insulating films 7 are formed on both sidewalls of the transfer gates 40 and 4. N-type impurity ions of high concentration are implanted utilizing the sidewall insulating films 7 as masks, so that N-type impurity diffused regions 8a and 8b of high concentration serving as a source/drain region are formed. In the above described manner, a region to be a source/drain region is formed to have an LDD structure comprising the N-type impurity diffused regions 6a and 6b of low concentration and the N-type impurity diffused regions 8a and 8b of high concentration. Meanwhile, if the N-type impurity diffused regions to be a source/drain region are formed not to have the LDD structure, N-type impurity ions of high concentration are implanted after the transfer gates 40 and 4 are formed. Thereafter, the sidewall insulating films 7 are formed on both sidewalls of the transfer gates 40 and 4. Whichever structure the N-type impurity diffused regions have, the N-type impurity diffused regions are subjected to annealing processing, so that the regions to be a source/drain region are electrically activated.

Figure 2H:
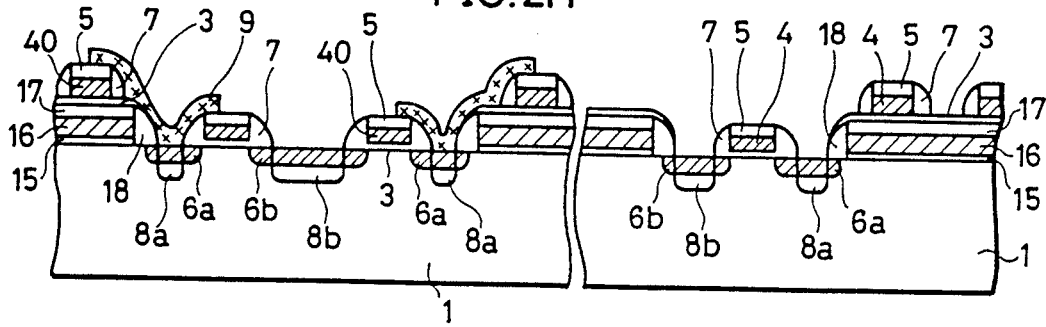

In FIG. 2H, a polysilicon film is deposited on the entire surface by the chemical vapor deposition process or the like. The polysilicon film is selectively removed by the photolithographic techniques and the etching techniques, so that a storage node 9 is formed so as to contact with the N-type impurity diffused regions 6a and 8a to be one of the source/drain regions in the memory cell forming region shown in the left half of FIG. 2H.

Figure 2I:
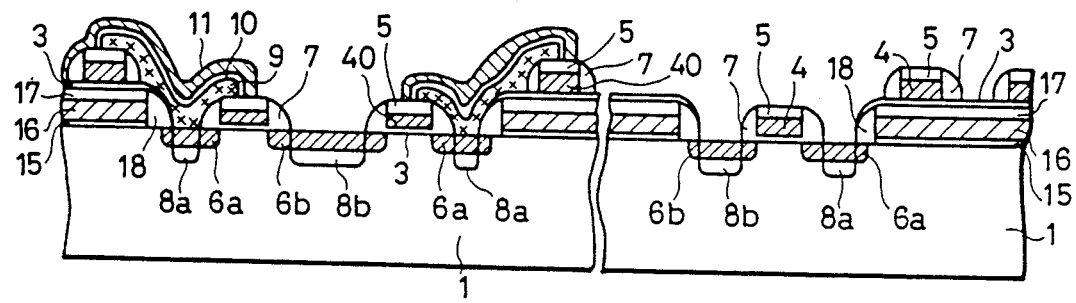

In FIG. 2I, a thin capacitor gate oxide film 10 is formed so as to cover the storage node 9 by the thermal oxidation process or the like. In addition, a polysilicon film is deposited on the entire surface by the chemical vapor deposition process or the like. This polysilicon film is selectively removed by the photolithographic techniques and the etching techniques, so that a cell plate 11 is formed so as to cover the capacitor gate oxide film 10 in the memory cell forming region shown in the left half of FIG. 2I.

Figure 2J:
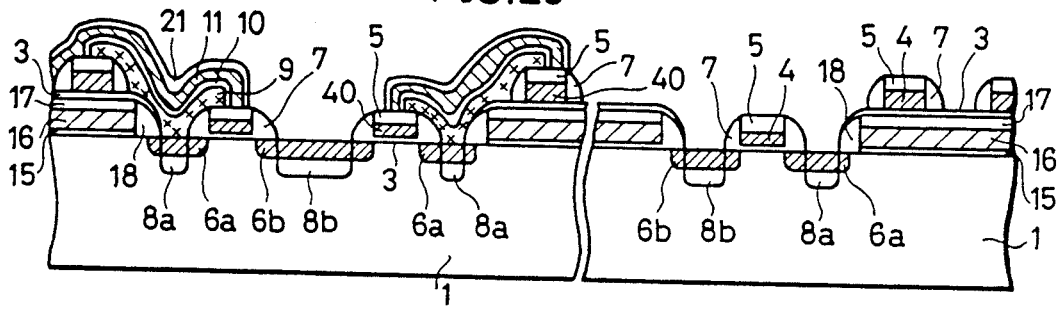

In FIG. 2J, a silicon oxide film is deposited on the entire surface by the chemical vapor deposition process or the like. This silicon oxide film is selectively removed using the anisotropic etching such as reactive ion etching (RIE), so that a capacitor insulating oxide film 21 is formed so as to cover the cell plate 11. In the above described manner, in the memory cell forming region, a stacked capacitor is formed so as to be connected to the N channel MOS transistor.

Figure 2K:
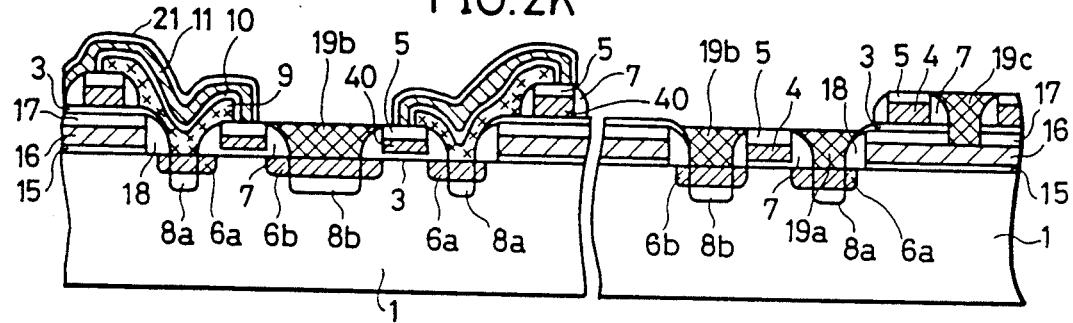

Then, in FIG. 2K, tungsten buried layers 19a, 19b and 19c are formed by a selective chemical vapor deposition (selective CVD) process using a silane (SiH$_4$) reduction process such that a tungsten film is selectively formed in all active regions and interconnection layer regions (a conductive layer portion such as an N-type impurity diffused region, a P-type impurity diffused region, a polysilicon layer having impurities doped thereto, a metal layer and a metal silicide layer). On this occasion, the tungsten buried layers 19a, 19b and 19c are respectively deposited to be formed to the vicinity of the upper surfaces of the transfer gates 40 and 4 and the isolation gate 16. Meanwhile, in an interconnection region in a peripheral circuit or the like shown in the right half of FIG. 2K, the upper surface of the isolation gate 16 is partially exposed, so that the tungsten buried layer 19c to be an interconnection layer is formed on the exposed surface.

In the above described manner, the tungsten buried layers 19a and 19b are formed, so that the resistance of an interconnection to a region to be a source/drain region is decreased. In addition, the highly integrated semiconductor device having a stepped structure is made coplanar by the tungsten buried layers 19a, 19b and 19c.

Figure 2L:
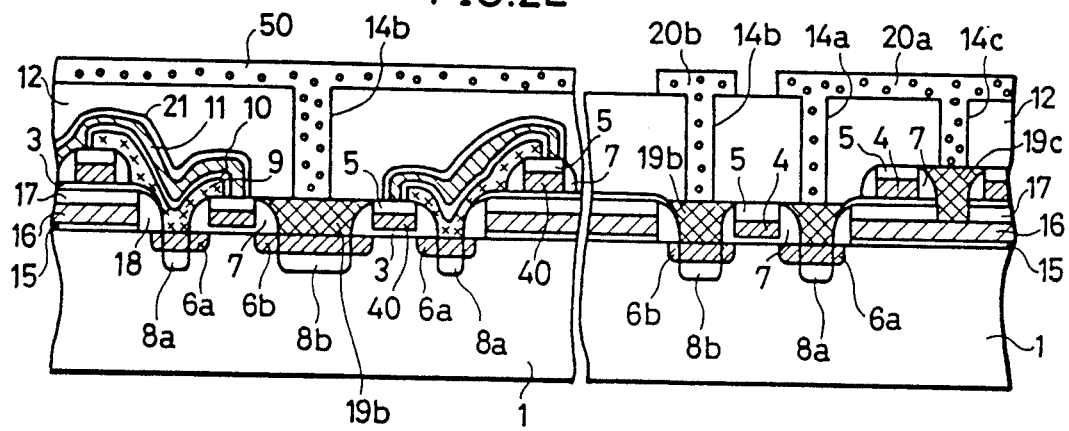
Figure 3:
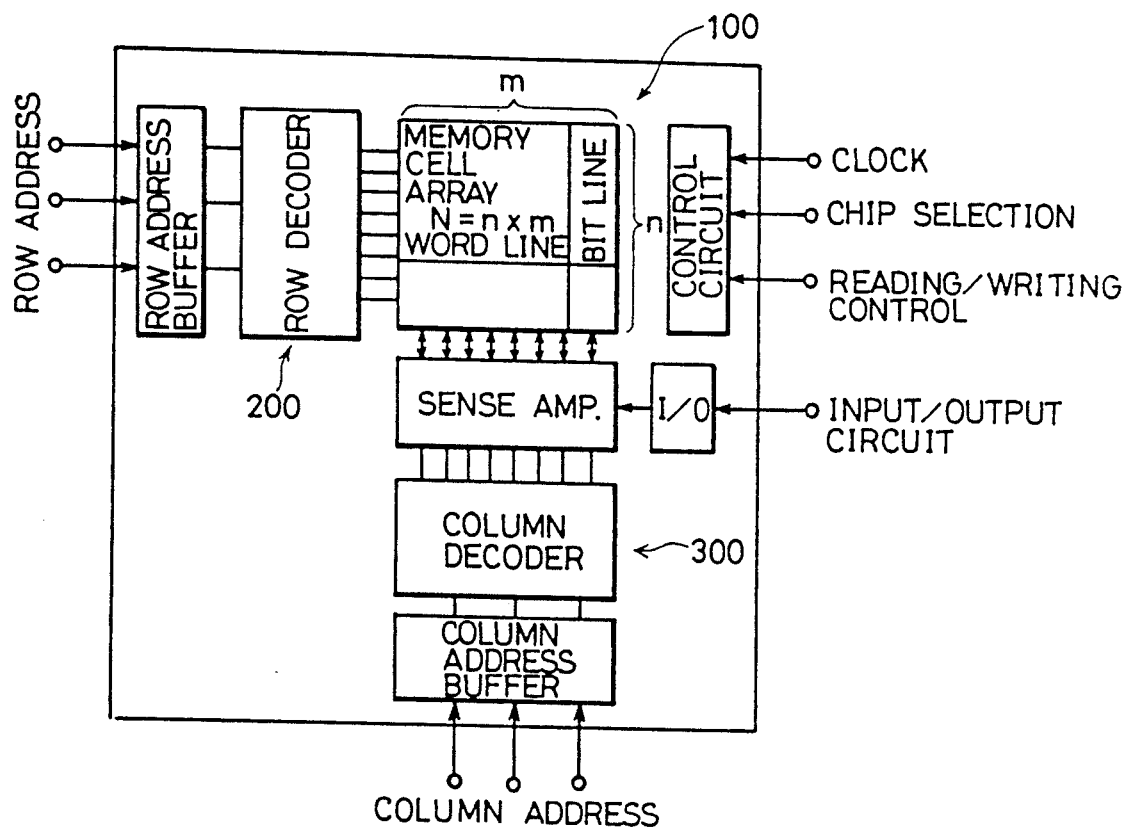
FIG. 3 is a block diagram showing an entire structure of a conventional DRAM.
Figure 4:
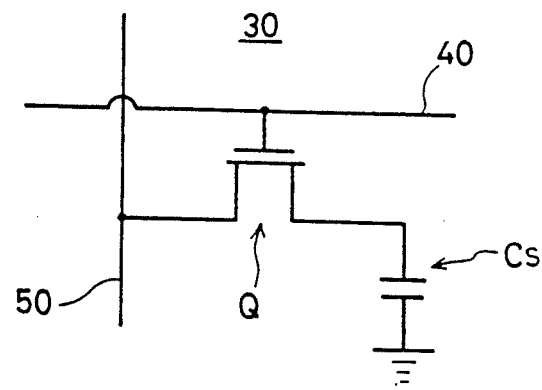
FIG. 4 is a circuit diagram showing an equivalent circuit corresponding to a single memory cell in the DRAM shown in FIG. 3.
Figure 5:
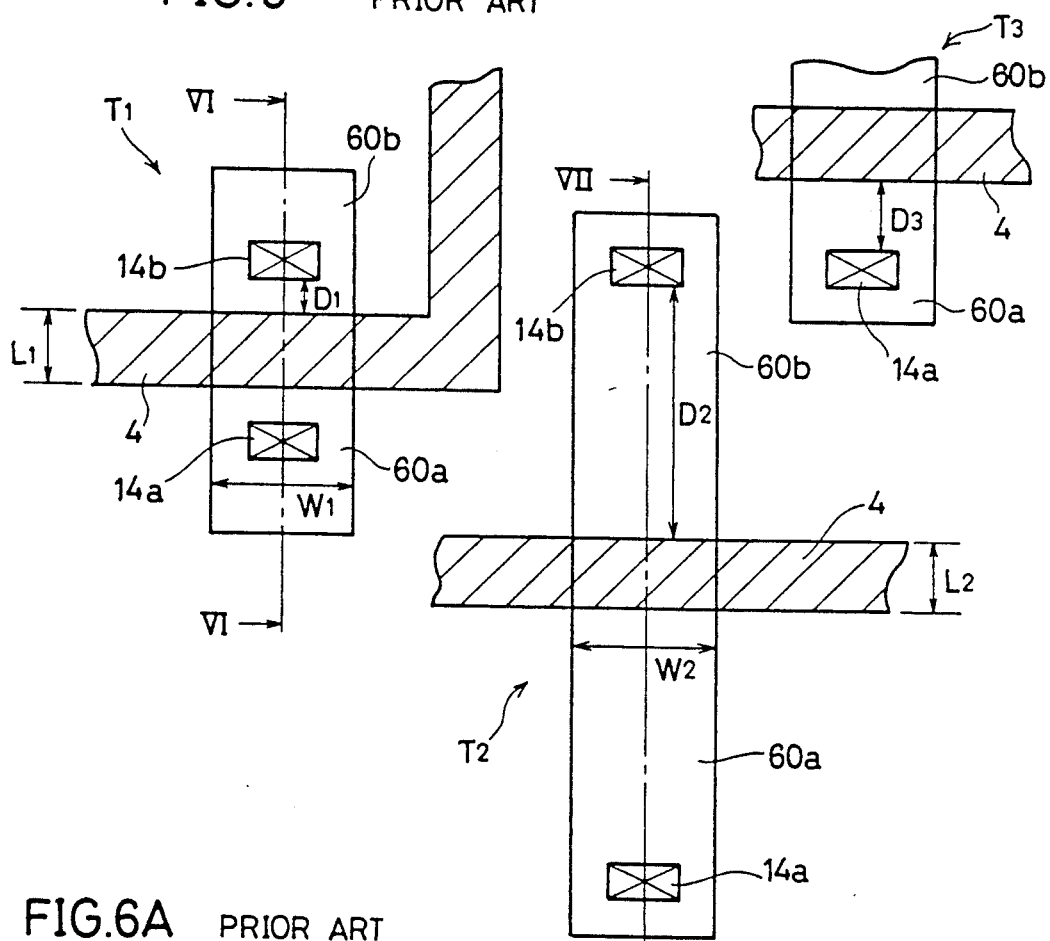
FIG. 5 is a partial plan view showing a region where a peripheral circuit or the like is formed in the conventional DRAM.
Figure 6A:
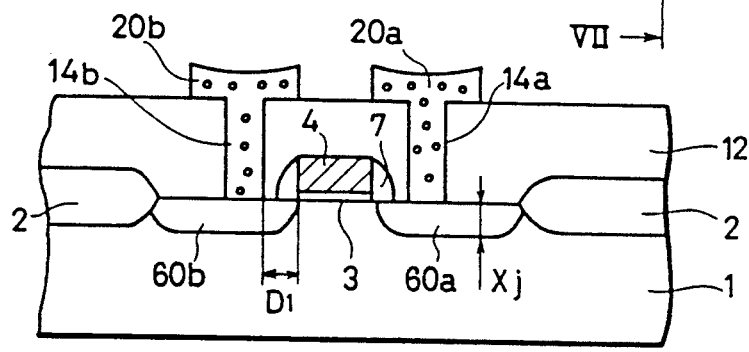
FIG. 6A is a partially sectional view showing a cross section taken along a line VI—VI shown in FIG. 5.
Figure 7A:
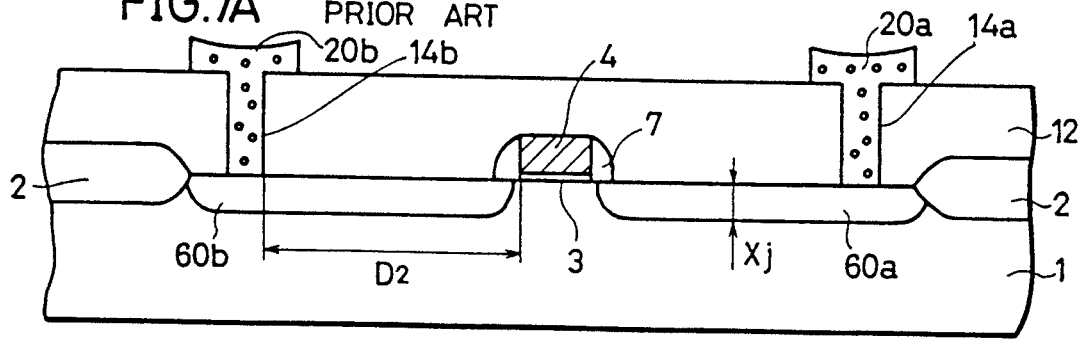
FIG. 7A is a partially sectional view showing a cross section taken along a line VII—VII shown in FIG. 5.
Figure 6B:
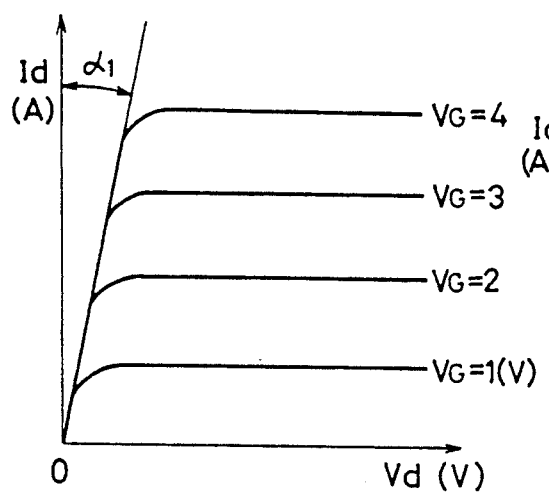
FIG. 6B is a graph showing drain current-drain voltage characteristics of a field effect transistor shown in FIG. 6A.
Figure 7B:
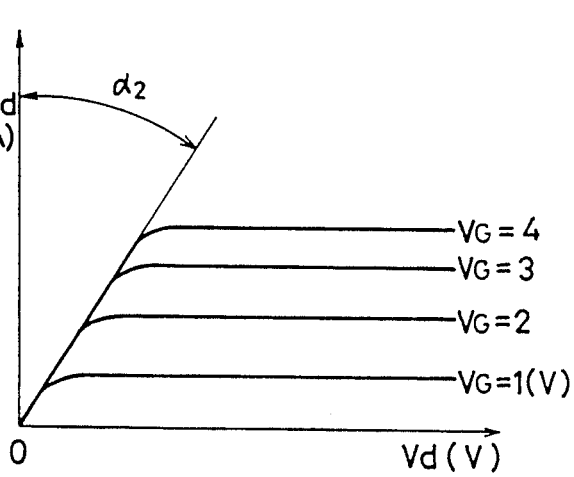
FIG. 7B is a graph showing drain current-drain voltage characteristics of a field effect transistor shown in FIG. 7A.
Figure 8:
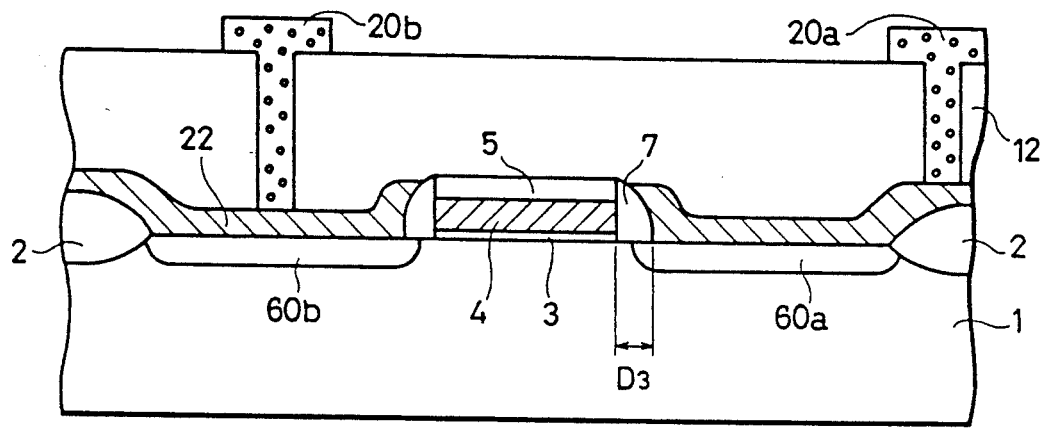
FIG. 8 is a partially sectional view showing an example of prior art disclosed to decrease the resistance of an interconnection to a source/drain region.
Figure 10:
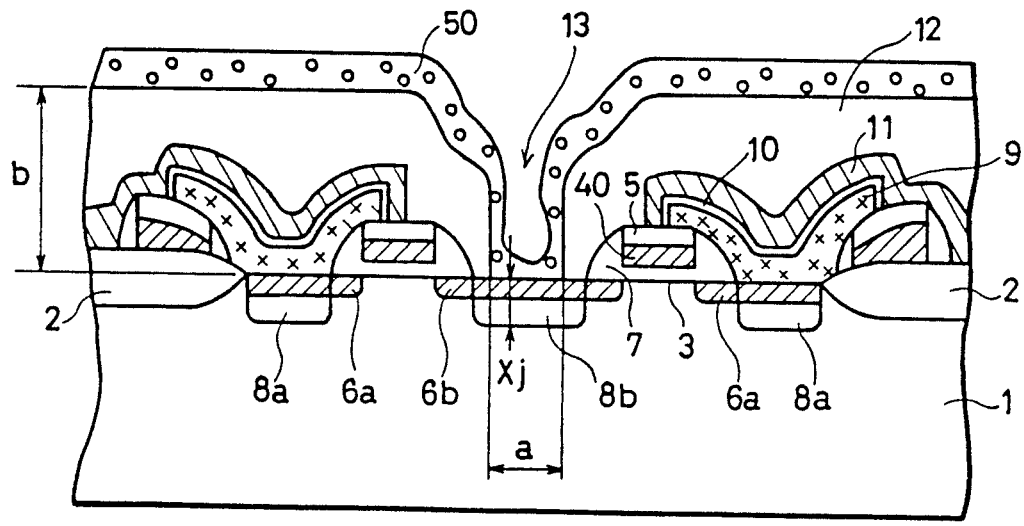
FIG. 10 is a partially sectional view showing a memory cell forming region in a conventional DRAM having memory cells of a stacked capacitor structure.
Figure 9A:
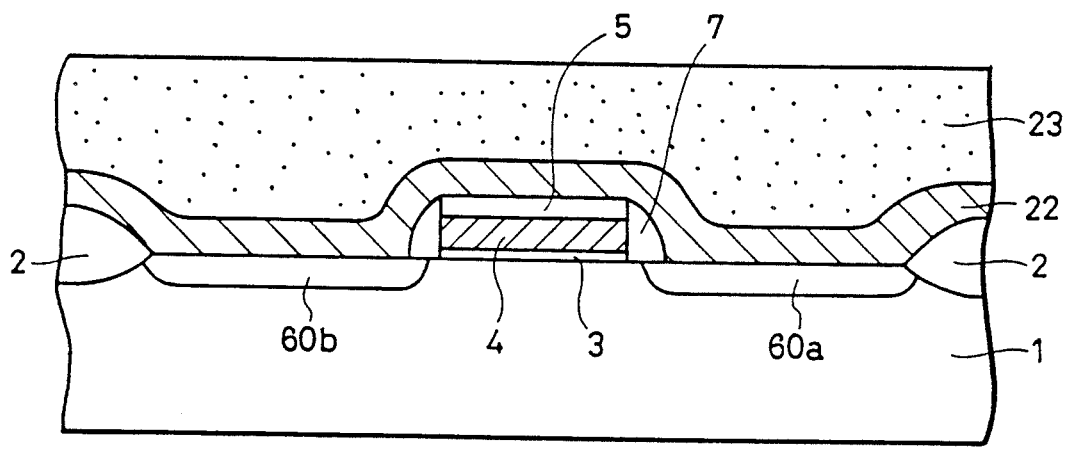
FIGS. 9A, 9B and 9C are partial cross sectional views showing, in this order, a method for forming a polysilicon layer in the structure of FIG. 8.
Figure 9B:
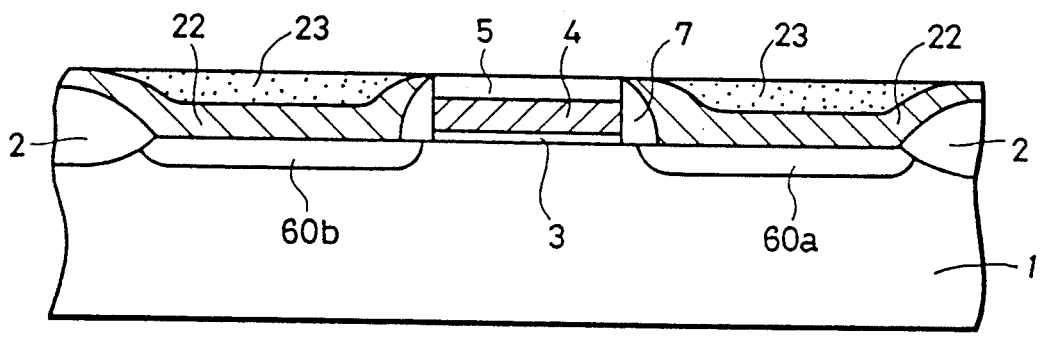
Figure 9C:
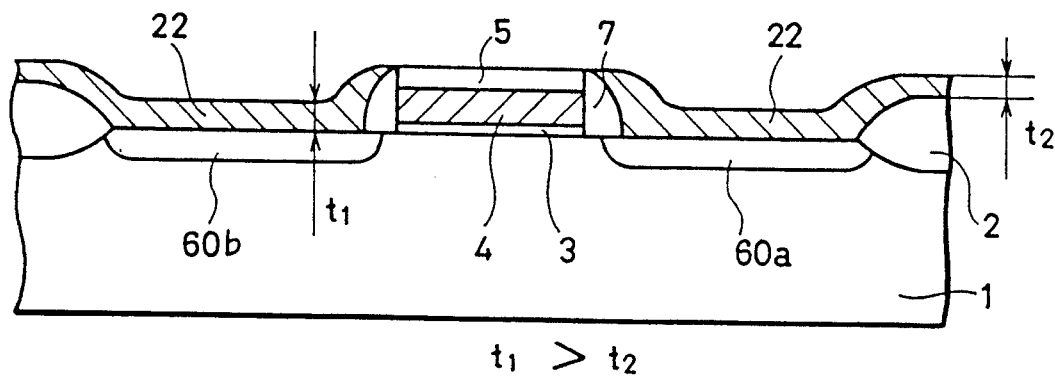

Finally, in FIG. 2L, an interlayer insulating film 12, for example, an interlayer insulating film such as ECR-SiO$_2$ and plasma SiO$_2$ is deposited on the entire surface to a thickness of about 5000Å at a low temperature of 400°C. to 500°C. On this occasion, the regions to be the source/drain region is made coplanar by the tungsten buried layers 19a and 19b. Thus, even when a BPSG (boro-phospho silicate glass) film, for example, formed as an interlayer insulating film at a low temperature is formed, reflow processing for making coplanar need not be preformed at a high temperature of 850°C. to 950°C. Processes at high temperature after the formation of the source/drain regions affects the source/drain regions, so that the following steps should preferably be carried out at lower temperature. Since the source/drain regions are made coplanar in advance and the reflow processing of the BPSG film can be carried out at a low temperature, the BPSG film is preferably used as the interlayer insulating film. Therefore, patterning of the interconnection layer in the subsequent processes is easily performed. Contact holes 14a, 14b, and 14c are formed on the interlayer insulating film 12 thus formed by the photolithographic techniques and the etching techniques. The contact holes 14a and 14b are formed so as to reach a part of each of the surfaces of the tungsten buried layers 19a and 19b formed as an interconnection to the source/drain region. In addition, the contact hole 14c is formed on the surface of the tungsten buried layer 19c formed as an interconnection layer. On this occasion, there is a good etching selectivity between the tungsten buried layers 19a, 19b, 19c and the oxide film/the silicon substrate during the dry etching process on the oxide film serving as the interlayer insulating film 12. More specifically, in the process of dry etching, the etching rate of the silicon oxide film is 800Å/min, the etching rate of the polysilicon layer is 200Å/min, the etching rate of the silicon substrate is 180Å/min and the etching rate of the tungsten buried layers is lower than 50Å/min. Therefore, even if the density of the contact holes is different in the memory cell area and in the peripheral circuit portions, there is no possibility of partial overetching, and the contact holes can be uniformly provided. A conductive film such as Al—Si film, an Al—Si—Cu film, a Ti film, a W film, a metal silicide film and a polyside film is deposited on the entire surface and then, this film is selectively removed by the photolithographic techniques and the etching techniques, so that an interconnection layer is formed. A bit line 50 is formed in the memory cell forming region. Interconnection layers 20a and 20b are formed in the region where a peripheral circuit and the like are formed.

In the above described manner, a DRAM is formed in which the resistance of an interconnection to a region to be a source/drain region is decreased and which has a coplanar cross-sectional structure.

In the above described embodiment, it is preferable that the isolation gates 16 respectively constituting field shields have a potential of the same level as that of a source electrode or a potential of a ground level. In addition, although in the above described embodiment, a structure in which the tungsten buried layers are completely buried between transfer gates and the isolation gates to make coplanar is shown in the cross-sectional view, the tungsten buried layers may be formed at least to the vicinity of the upper surfaces of the transfer gates and the isolation gates, to obtain the same effect.

In addition, although in the above described embodiment, both materials for constituting an isolation gate and a transfer gate are polysilicon, one of the gates may be formed of a polyside (double layer film made by polysilicon film and metal silicide layer) film and the other gate may be formed of a polysilicon film.

Furthermore, although in the above described embodiment, a tungsten film is selectively formed in a conductive layer portion by chemical vapor deposition, a conductive material may be used which can be selectively formed in the conductive layer portion by chemical vapor deposition. For example, such a conductive material can comprise metals such as Al, Mo, TaSi$_2$ and TiSi$_2$ and metal silicide.

Although the above described embodiment shows a semiconductor device in which an N channel MOS transistor is formed on a P-type silicon substrate, a P channel MOS transistor of a conductivity type opposite to that of the N channel MOS transistor may be formed on an N-type silicon substrate, to obtain the same effect.

Additionally, although the above described embodiment showing the steps of a manufacturing method shows a DRAM having memory cells of a stacked capacitor structure, a DRAM to which the present invention is applied is not limited to the same. In addition, the present invention is applied to not only the DRAM but also a wide field of a semiconductor device having at least a field effect transistor.

As described in the foregoing, according to the present invention, a conductor layer is formed so as to selectively fill an impurity region, so that a semiconductor device can be made coplanar. In addition, the resistance of an interconnection to the impurity region can be decreased, so that the degree of freedom of a portion where the impurity region and an interconnection layer formed above the impurity region electrically contact with each other is increased. Thus, designing and manufacturing processes of the semiconductor device become simple.

Additionally, according to the present invention, a semiconductor device having highly integrated memory cells can be made coplanar.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a semiconductor substrate of a first conductivity type having major surface,
    field shield conductor layers formed spaced apart from each other on the major surface of said semiconductor substrate through an insulating film and with the surface thereof being covered with the insulating film,
    a control gate conductor layer formed on the major surface of said semiconductor substrate between said field shield conductor layers through an insulating film and with the surface thereof being covered with the insulating film,
    an impurity region of a second conductivity type formed between each of said field shield conductor layers and said control gate conductor layer and on the major surface of said semiconductor substrate, and
    an interconnection layer formed so as to selectively fill a portion on an exposed major surface of said impurity region between each of said field shield conductor layers and said control gate conductor layer,
    wherein said interconnection layer is formed substantially coplanar with said field shield conductor layers and said control gate conductor layer and top surfaces of said field shield conductor layers are substantially coplanar with a top surface of said central gate conductor layer.

2. The semiconductor device according to claim 1, wherein said interconnection layer comprises a film selectively formed by chemical vapor deposition on the major surface of said impurity region.

3. The semiconductor device according to claim 2, wherein said film comprises a metal film.

4. The semiconductor device according to claim 2, wherein said film comprises a metal silicide film.

5. The semiconductor device according to claim 1, wherein each of said field shield conductor layers has a surface exposed, and said interconnection layer comprises a conductor layer selectively formed on its surface.

6. The semiconductor device according to claim 5, which further comprises an interconnection layer formed so as to contact with the surface of said interconnection layer.

7. The semiconductor device according to claim 1, wherein said semiconductor device comprises a plurality of field effect devices formed, isolated by said field shield conductor layers each having a surface covered with an insulating film.

8. The semiconductor device according to claim 7, wherein each of said field effect devices comprises said control gate conductor layer and said impurity region, said control gate conductor layer is a gate electrode, and said impurity region has one and the other impurity regions constituting a source region and a drain region.

9. The semiconductor device according to claim 8, wherein said semiconductor device further comprises a capacitance portion connected to the field effect device on the major surface of said semiconductor substrate.

10. The semiconductor device according to claim 9, wherein said capacitance portion has a stacked structure comprising a conductive film formed in contact with one of said impurity regions, an insulating film formed on the surface of the conductive film, and a conductive film formed on the insulating film, to constitute a capacitor for storing charges.

11. The semiconductor device according to claim 10, wherein said capacitance portion is formed so as to extend above said field shield conductor layers and said control gate conductor layer.

12. A semiconductor device comprising:
a plurality of MOS transistors formed on a substrate and each having a pair of source/drain regions and a gate electrode, an area of source/drain regions in at least one of said MOS transistors being larger than that of the other MOS transistors;
an insulator layer formed on the surface of said substrate and said gate electrodes of MOS transistors and having a plurality of holes thereof positioned at said source/drain region and extending to the surface of said substrate,
an area of one said holes positioned at a source/drain region of said at least one of said MOS transistors being larger than an area of a hole positioned at another MOS transistor;
a plurality of refractory metal regions filled in said plurality of holes,
a thickness of said refractory metal regions being substantially the same as a depth of said holes, and
a plurality of a wiring layers connected to said refractory metal regions, respectively.

* * * * *

UNITED STATES PATENT AND TRADEMARK OFFICE
CERTIFICATE OF CORRECTION

PATENT NO. : 4,994,893
DATED : February 19, 1991
INVENTOR(S) : Hiroji OZAKI et al.

It is certified that error appears in the above-identified patent and that said Letters Patent is hereby corrected as shown below:

On the title page, Item [54] should read as follows:

--FIELD EFFECT TRANSISTOR HAVING SUBSTANTIALLY COPLANAR SURFACE STRUCTURE--

Signed and Sealed this

Sixth Day of April, 1993

*Attest:*

STEPHEN G. KUNIN

*Attesting Officer*  Acting Commissioner of Patents and Trademarks